US009973107B2

(12) United States Patent
Cerqueira Pinto Bezerra Varajão et al.

(10) Patent No.: US 9,973,107 B2
(45) Date of Patent: May 15, 2018

(54) AC/DC CONVERTER WITH THREE TO SINGLE PHASE MATRIX CONVERTER, FULL-BRIDGE AC/DC CONVERTER AND HF TRANSFORMER

(71) Applicant: Inesc Tec—Instituto de Engenharia de Sistemas e Computadores, Tecnologia e Ciência, Porto (PT)

(72) Inventors: Diogo André Cerqueira Pinto Bezerra Varajão, Ponte de Lima (PT); Luís Miguel Faria Miranda, Moure BCL (PT); Rui Manuel Esteves Araújo, Oporto (PT)

(73) Assignee: Inesc Tec—Instituto de Engenharia de Sistemas, Porto (PT)

( * ) Notice: Subject to any disclaimer, the term of this patent is extended or adjusted under 35 U.S.C. 154(b) by 0 days. days.

(21) Appl. No.: 15/503,488

(22) PCT Filed: Aug. 11, 2015

(86) PCT No.: PCT/IB2015/056113
§ 371 (c)(1),
(2) Date: Feb. 13, 2017

(87) PCT Pub. No.: WO2016/024223
PCT Pub. Date: Feb. 18, 2016

(65) Prior Publication Data
US 2017/0229972 A1    Aug. 10, 2017

(30) Foreign Application Priority Data

Aug. 13, 2014  (PT) .......................................... 107844

(51) Int. Cl.
H02M 7/217      (2006.01)
H02M 5/297      (2006.01)
(Continued)

(52) U.S. Cl.
CPC .......... H02M 7/217 (2013.01); G01R 25/005 (2013.01); H02J 3/38 (2013.01); H02M 5/297 (2013.01);
(Continued)

(58) Field of Classification Search
CPC .. H02M 5/14; H02M 2001/007; H02M 7/217; H02M 7/797; H02M 7/4807
See application file for complete search history.

(56) References Cited

U.S. PATENT DOCUMENTS 5,345,375 A *  9/1994  Mohan ...................... H02J 3/01
                                                      307/105
8,804,388 B2 *  8/2014  Fattal .................. H02M 1/4216
                                                      363/126
(Continued)

FOREIGN PATENT DOCUMENTS

CN      101702588      5/2010
CN      101944745      1/2011
(Continued)

OTHER PUBLICATIONS

C. Ga-Gang; J. Doo-Yong; C. Sung-Chon; W. Chung-Yuen; J. Yong-Chae; Y. Jang-Hyoun: "10kW rapid-charger for electric vehicle considering vehicle to grid(V2G)", Power Electronics and Motion Control Conference (IPEMC), 2012 7th International, 2012, pp. 2668-2672.
(Continued)

*Primary Examiner* — Yusef A Ahmed
(74) *Attorney, Agent, or Firm* — Leason Ellis LLP

(57) ABSTRACT

A solution that intends to solve the problem of providing a single-stage bidirectional power conversion system (PCS) with a controllable power factor and the capability to regulate the current in the DC side. Disclosed is a single-stage, bidirectional and high-frequency isolated PCS,
(Continued)

Grid | Input Filter | Three-phase to Single-phase Matrix Converter | High-frequency Transformer | Full-Bridge | Output Filter | Battery Pack including a high-frequency transformer (HFT), a three-phase-to-single-phase matrix converter (MC), a full-bridge (FB) AC to DC converter, and a control system, where the control system outputs are connected to the switches of the MC and the FB converter. Moreover, the PCS output can also form a DC network for energy supply of several devices. This system converts three-phase AC power input from the network into DC power output that can be used for example to charge an energy storage device or supply a direct current distribution system. It is also possible to convert DC power input into AC power output to supply the network.

14 Claims, 17 Drawing Sheets

(51) Int. Cl.
    *G01R 25/00*     (2006.01)
    *H02J 3/38*     (2006.01)
    *H02M 7/48*     (2007.01)
    *H02M 7/797*     (2006.01)

(52) U.S. Cl.
    CPC ......... *H02M 7/4807* (2013.01); *H02M 7/797* (2013.01)

(56) References Cited

U.S. PATENT DOCUMENTS

| | | | | |
|---|---|---|---|---|
| 2003/0095424 A1* | 5/2003 | Oates | ............... | H02J 3/00 363/132 |
| 2009/0295229 A1* | 12/2009 | Harke | ............... | H02M 7/217 307/75 |
| 2011/0007534 A1 | 1/2011 | Gupta et al. | | |
| 2011/0227407 A1* | 9/2011 | Ransom | ............... | B60L 3/00 307/9.1 |
| 2014/0085956 A1* | 3/2014 | Koyano | ............... | H02M 5/293 363/156 |
| 2014/0140112 A1* | 5/2014 | Zhou | ............... | H02M 1/126 363/40 |
| 2014/0192578 A1* | 7/2014 | Koyano | ............... | H02M 5/293 363/149 |
| 2014/0226386 A1* | 8/2014 | Saito | ............... | H02M 5/293 363/132 |
| 2014/0247635 A1* | 9/2014 | Koyano | ............... | H02M 5/297 363/148 |
| 2015/0155716 A1* | 6/2015 | Balda | ............... | H02M 5/4585 363/35 |
| 2017/0279370 A1* | 9/2017 | Zhao | ............... | H02M 7/1626 |

FOREIGN PATENT DOCUMENTS

| | | |
|---|---|---|
| CN | 102075109 | 5/2011 |
| CN | 101604853 | 2/2012 |
| JP | 2013021867 | 1/2013 |

OTHER PUBLICATIONS

D. Sha; Z. Qin; D. Wu; X. Liao: "A Digitally Controlled Three-Phase Cycloconverter Type High Frequency AC Link Inverter Using Space Vector Modulation", Journal of Power Electronics (KIPE), vol. 11, 2011, pp. 28-36.

Garces A et al: "Impact of operation principle on the losses of a reduced matrix converter for offshore wind parks", Industrial Electronics (ISIE), 2010 IEEE International Symposium on, IEEE, Piscataway, NJ, USA, Jul. 4, 2010 (Jul. 4, 2010), pp. 2412-2419, XP031803151, ISBN: 978-1-4244-6390-9.

H. S. Krishnamoorthy; P. Garg; P. N. Enjeti: "A matrix converter-based topology for high power electric vehicle battery charging and V2G application", IECON 2012—38th Annual Conference on IEEE Industrial Electronics Society, 2012, pp. 2866-2871.

M. N. Kheraluwala; R. W. Gascoigne; D. M. Divan; E. D. Baumann: "Performance characterization of a high-power dual active bridge", Industry Applications, IEEE Transactions on, vol. 28, 1992, pp. 1294-1301.

N. D. Weise; K. Basu; N. Mohan: "Vehicle Power and Propulsion Conference (VPPC)", 2011, IEEE, article "Advanced modulation strategy for a three-phase AC-DC dual active bridge for V2G", pp. 1-6.

Nathan D Weise et al: "Universal utility interface for Plug-in Hybrid electric vehicles with vehicle-to-grid functionality", 2010 IEEE Power and Energy Society General Meeting : [IEEE PES-GM 2010] ; Minneapolis, Minnesota, USA, Jul. 25-29, 2010, IEEE, Piscataway, NJ, USA, Jul. 25, 2010 (Jul. 25, 2010), pp. 1-8, XP031985603, ISBN: 978-1-4244-6549-1, DOI: 10.1109/PES. 2010.5589710.

S. Ratanapanachote; C. Han Ju; P. N. Enjeti: "A digitally controlled switch mode power supply based on matrix converter", Power Electronics, IEEE Transactions on, vol. 21, 2006, pp. 124-130.

S. Vazquez; S. M. Lukic; E. Galvan; L. G. Franquelo; J. M. Carrasco: "Energy Storage Systems for Transport and Grid Applications", Industrial Electronics, IEEE Transactions on, vol. 57, 2010, pp. 3881-3895.

Y. Zhaoyang; J. Minli; Z. Chunjiang; W. Weiyang: "An Integration SPWM Strategy for High-Frequency Link Matrix Converter With Adaptive Commutation in One Step Based on De-Re-Coupling Idea", Industrial Electronics, IEEE Transactions on, vol. 59, 2012, pp. 116-128.

* cited by examiner

AC/DC CONVERTER WITH THREE TO SINGLE PHASE MATRIX CONVERTER, FULL-BRIDGE AC/DC CONVERTER AND HF TRANSFORMER

CROSS-REFERENCE TO RELATED APPLICATIONS

This application is a U.S. National Stage Application under 35 U.S.C. § 371 of International Patent Application No. PCT/IB2015/056113, filed Aug. 11, 2015 which claims priority to Portugal Application No. 107844, filed Aug. 13, 2014, which are hereby incorporated by reference in their respective entireties.

TECHNICAL FIELD

The present application relates to a power conversion system (PCS).

BACKGROUND

A PCS aims to convert electric energy from one form to another, for example converting between AC and DC.

A classical PCS is implemented with a three-phase voltage source converter (VSC) and a bidirectional buck-boost DC-DC converter to regulate the voltage and current in the batteries [1], [2]. The galvanic isolation between the grid and the battery pack is provided by a low-frequency transformer. This solution has as advantages a low complexity, due to reduced number of components, well-known control and design techniques, and wide availability of integrated components. The use of a low-frequency transformer is however not suitable to obtain a high-power density conversion system.

An alternative is to employ a high-frequency transformer (HFT) in the DC-DC conversion stage in order to significantly reduce the size and volume of the transformer. Possible topologies for the high-frequency isolated DC-DC converter are dual half-bridge (DHB), dual active-bridge (DAB) [3] or resonant DC-DC converters. A well-known topology consists in a three-phase VSC to interface the grid and a DAB to regulate the voltage and current in the batteries [4], [5]. Nevertheless, the need of a DC-link to decouple the operation of the three-phase VSC from the DC-DC converter is also a limitation in terms of volume and shorter life of the capacitors.

Several single-stage power converters were proposed to perform bidirectional AC-DC power conversion as a possible alternative for the traditional two-stage solutions described above. The use of a matrix converter (MC) for the front-end is an interesting solution as it provides the capability to perform a direct AC to AC conversion without a DC-link. In [6], [7] and [8] the authors propose the use of a three-phase-to-single-phase MC and a full-bridge (FB) to do the interface of a DC source with the grid. These approaches focus on the operation as an inverter to supply the grid, using the converter as a voltage source in the grid side. Issues related with the DC source, that can be for example a storage unit, are not addressed, such as current regulation, charging and discharging methods, protections, current and voltage ripple.

Another publications propose the use of space vector modulation for the same conversion circuit [9], [10] and [11]. However, these authors do not focus on the interface with the DC source, which is, for example, a requirement for energy storage applications. Moreover, the capability to control the power factor is not described.

Using the three-phase-to-single-phase matrix converter as a current source in the grid side is also a possibility. In document US 2011/0007534 A1 and references [12], [13] and [14] modulations to control the power converter as a bidirectional unit are proposed. These solutions allow the current regulation in the storage device but do not allow the control of the power factor, keeping it near unitary.

SUMMARY

The present application discloses a single-stage PCS, comprising:
  a high-frequency transformer;
  a three-phase-to-single-phase matrix converter;
  a full-bridge AC to DC converter; and
  a control system,
where the control system outputs are connected to the switches of the matrix converter and the full-bridge converter.

In one embodiment, the PCS further comprises an input filter and an output filter.

In another embodiment, the input and output filters are LC filters with one or more damping resistors connected with the inductances and/or the capacitances.

In a further embodiment, the PCS further comprises an electromagnetic interference filter connected between the AC side and the input filter.

In one embodiment, the three-phase-to-single-phase matrix converter comprises bidirectional switches with one of the configurations:
  a common-source configuration;
  a common-drain configuration;
  a diode bridge with a controlled power switch; or
  a reverse voltage blocking switch.

In another embodiment, the full-bridge converter comprises a parallel association of two legs, where each leg is composed by two switches in series.

In a further embodiment, the control system comprises:
  a peak value input of the three-phase input voltages $V_{a,b,c}$;
  a set-point input $\varphi_i$; and
  a phase-shift input $\varphi$.

In one embodiment, the PCS further comprises:
  a phase detector module, configured to calculate the angle $\alpha_i$ of the input voltage space vector of the three-phase AC side;
  an adder module, configured to calculate a desired phase angle $\beta_i$ subtracting angle $\alpha_i$ with the set-point input $\varphi_i$;
  a sector detector module, configured to calculate a sector K that comprises an input phase angle $\beta_i$;
  a switching space vectors selection module, configured to select a switching space vector $SSV_s$ based on the sector K;
  an angle normalization module, configured to normalize the phase angle, $\beta_i$, as an angle within the sector, $\theta_i$;
  a duty cycle calculation module, configured to calculate duty cycles $d_1$ and $d_2$ for the two general switching states based on angle $\theta_i$; and
  a command signals generation module, configured to output ON/OFF signals to the matrix converter and the full-bridge converter switches based on the $SSV_s$, $d_1$, $d_2$ and the phase-shift input $\varphi$.

In another embodiment, the PCS further comprises a current controller configured to regulate an output current $i_{dc}$ imposed by a phase-shift input $\varphi$.

In a further embodiment, the current controller further comprises an outer control loop configured to set the reference for the output current $i_{dc}$ based on a comparison between a reference $V_{dc,ref}$ and a DC side voltage $V_{dc}$.

In one embodiment, the control system further comprises a control loop configured to regulate the power factor in the AC side based on the power calculation and the comparison between a reference $\cos(\varphi_i)_{ref}$ and a $\cos(\varphi_i)$.

In another embodiment, the PCS further comprises a PQ controller configured to regulate the active and reactive power level based on a power calculation and the comparison with respective reference values.

This application discloses the use of the PCS as an inverter for energy harvesting from DC sources.

This application also discloses the use of the PCS as a battery-based stationary energy storage systems.

This application further discloses the use of the PCS as an interface between AC networks and DC networks.

This application discloses the use of the PCS as an electric vehicle battery charger.

This application also discloses the use of the PCS wherein the charger is on-board or off-board.

This application further discloses a distributed energy storage system, where the energy storage system comprises the PCS described.

This application discloses a Vehicle-to-Grid system comprising the PCS.

GENERAL DESCRIPTION

The present application presents a solution that intends to solve the problem of providing a single-stage bidirectional PCS with a controllable power factor and the capability to regulate the current in the DC side.

Disclosed is a single-stage, bidirectional and high-frequency isolated PCS, including the control system to do the interface between the three-phase AC distribution network and a DC sources/loads, for example a battery. Moreover, the PCS output can also form a DC network for energy supply of several devices.

The proposed main circuit does not have a DC-link capacitor and the galvanic isolation is achieved using a HFT thereby reducing circuit volume, weight, and losses, resulting in a more compact solution and with a longer service life when compared with existing technical solutions.

The modulation allows to control simultaneously the power factor in the grid interface and the current in the battery pack, or in the formed DC network. Active power (P) and reactive power (Q) can be controlled to provide services for the grid operator or to comply with standards. A higher power quality in the grid interconnection is also obtained due to the use of a new space vector modulation. The DC current has an accurate regulation and low ripple, making possible to supply sensitive loads such as an energy storage device or a DC distribution system.

The combination of the developed control system with the proposed main circuit results, for example, in a PCS for energy storage devices. The single-stage PCS, when compared with conventional solutions, has as advantages a higher power density, longer service life, higher power quality in the grid interconnection, power factor control capability, safe operation provided by galvanic isolation, wide DC voltage range of energy storage devices, and DC current regulation with low current ripple.

BRIEF DESCRIPTION OF DRAWINGS

Without intent to limit the disclosure herein, this application presents attached drawings of illustrated embodiments for an easier understanding.

MODE(S) FOR CARRYING OUT EMBODIMENTS

Figure 1:
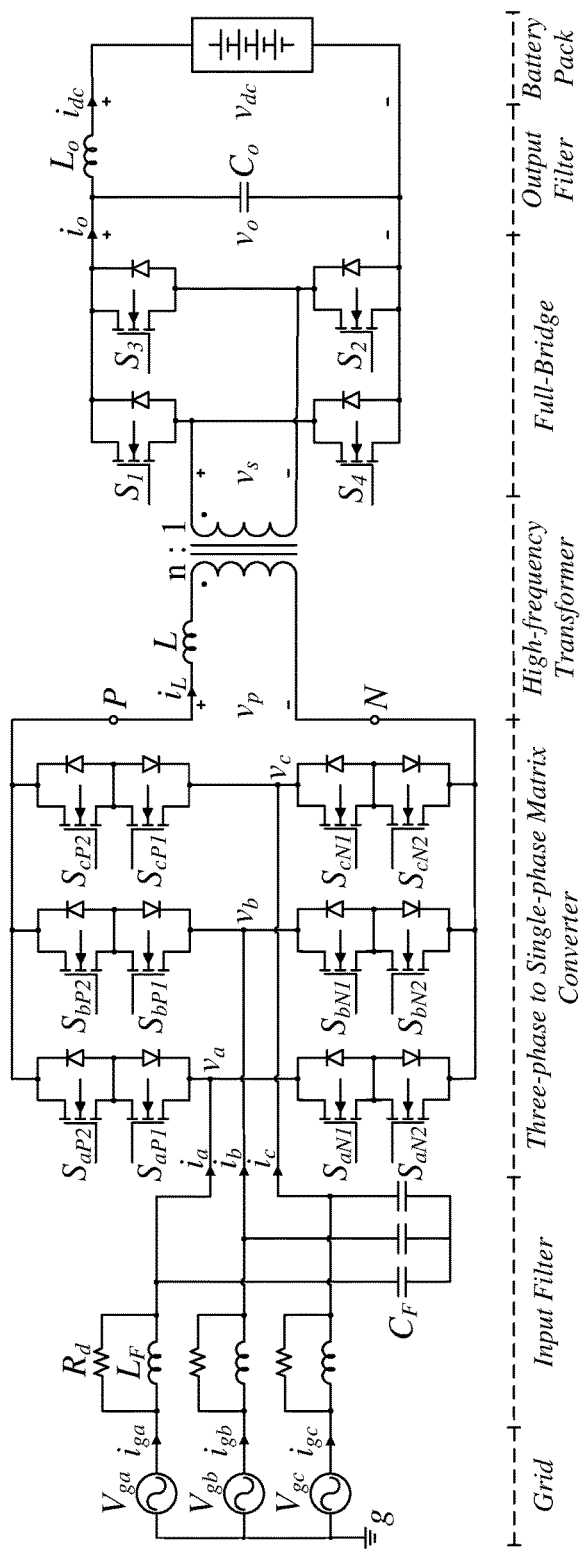
FIG. 1: Topology for the PCS based on matrix converter with a HFT.

Referring to the drawings, herein are described optional embodiments in more detail, which however are not intended to limit the scope of the present application.

In this document, the topology for the PCS as well the proposed modulation and control strategies are described.

Topology

The main circuit comprises an input filter, a three-phase-to-single-phase matrix converter (MC), a high-frequency transformer (HFT), a full-bridge (FB) converter and an output filter, as represented in FIG. 1. In one embodiment, the FB converter has a parallel association of two legs, where each leg is composed by two switches in series. Each one of the switches can be composed by parallel and/or series of multiple devices. The input filter can have several configurations (inductor-capacitor circuit, LC, is presented) and is necessary to attenuate the voltage and current harmonic content, allowing the connection with the grid. In one embodiment, the input filter is implemented with a single or multiple stage LC filter with one or more damping resistors connected in series or parallel with the inductances and/or the capacitances. The MC is a key element of this topology and performs a direct AC to AC conversion between the three-phase low frequency grid voltage and a single-phase high-frequency voltage to supply the transformer. The transformer turns ratio can be designed in order to apply this converter for a wide voltage range of energy storage devices. Using high-frequency has also the advantage of significantly reducing the volume and weight of the transformer, resulting in a more compact conversion system. The FB converts the high frequency AC voltage from the HFT secondary to DC voltage for the load (battery in this case) when operating in AC-DC mode, and do the opposite in DC-AC power flow.

An output filter is added between the FB and the output, necessary to reduce the voltage and current ripple at the converter output. In one embodiment, the output filter is a single or multiple stage LC filter with one or more damping resistors connected in series or parallel with the inductances and/or the capacitances.

Figure 2:
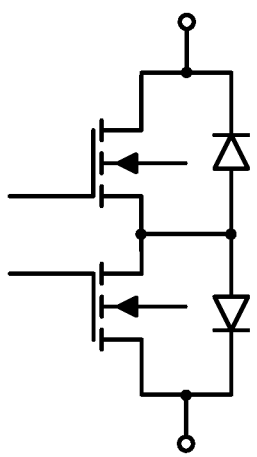
FIG. 2: Example of a possible configuration to build the bidirectional switch as a common-source configuration (MOSFET).
Figure 3:
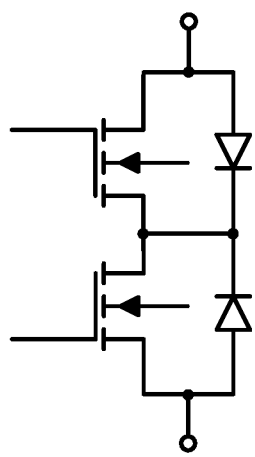
FIG. 3: Example of a possible configuration to build the bidirectional switch as a common-drain configuration (MOSFET).
Figure 4:
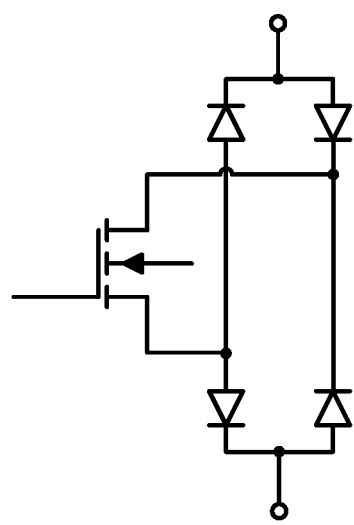
FIG. 4: Example of a possible configuration to build the bidirectional switch as a diode bridge with a controlled power switch.
Figure 5:
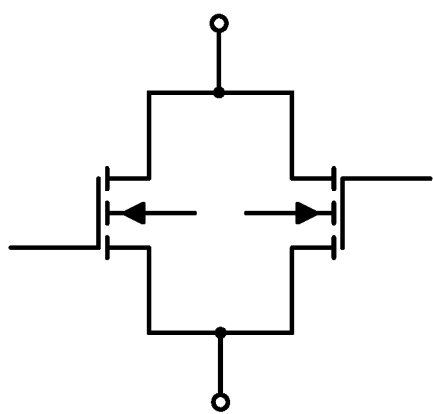
FIG. 5: Example of a possible configuration to build the bidirectional switch as a reverse voltage blocking switches.

The front-end converter for the proposed PCS consists in a three-phase-to-single-phase MC. This converter is composed by six bidirectional switches that can be built with the configurations presented in FIGS. 2, 3, 4 and 5. A bidirectional switch is characterized by the capability to operate in the four-quadrants of voltage-current plane. In this way, a bidirectional switch is capable of blocking voltage and conducting current in both directions [15]. Metal-oxide-semiconductor field-effect transistor (MOSFET) and insulated-gate bipolar transistor (IGBT) types are commonly applied in these power converters. Emerging technologies, such as silicon carbide (SiC) and gallium nitride (GaN) power semiconductor devices can also be employed. There are several possibilities to build the bidirectional switch, such as the examples of FIGS. 2, 3, 4 and 5. One possibility is represented in FIG. 2, and is obtained by combining discrete devices in a common-source configuration in the case of MOSFET, or in a common-emitter configuration in the case of IGBT. A similar approach is to combine discrete devices in a common-drain configuration in the case of MOSFET (see FIG. 3), or in a common-collector configuration in the case of IGBT. A diode bridge with a controlled power switch is another solution as represented in FIG. 4. Using discrete switches with reverse voltage blocking capability in a back-to-back configuration is other possibility as represented in FIG. 5. Moreover, if the transistor has reverse voltage blocking capability and can conduct positive and negative current, only one discrete device can be employed to build the bidirectional switch.

In the topology of FIG. 1, a common-source configuration is employed through the use of 12 N-type MOSFET with freewheeling diodes. Each bidirectional switch is composed by two transistors, $S_{xy1}$ and $S_{xy2}$, where x=a,b,c and y=P,N. In the following analysis will be used $S_{xy}$ to refer to the bidirectional switch composed by $S_{xy1}$ and $S_{xy2}$ transistors. For example, switch $S_{aP}$ connects input phase a to the P bar and is composed by transistors $S_{aP1}$ and $S_{aP2}$.

Figure 6:
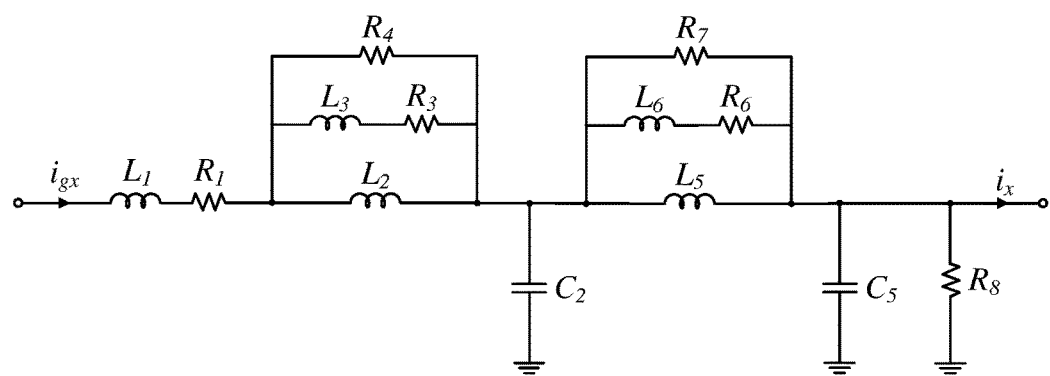
FIG. 6: Equivalent single-phase input filter generalized structure [16].

The MC works as a current source rectifier (CSR) with the purpose of generating sinusoidal input currents and high-frequency output voltages to be applied in the transformer. Due to the high harmonic content present in the input currents of the MC itself, an input filter is necessary to allow the connection with the grid in compliance with power quality standards. A generalized structure for the input filter is represented in FIG. 6. Parasitic elements of the components are not considered in this representation. The filter parameters should be adjusted to choose the most suitable filter topology for a given set of specifications. A single-stage LC filter with damping resistor connected in parallel with an inductance is used in FIG. 1. This filter topology is a subset of the generalized structure represented in FIG. 6. A careful dimensioning of the filter is essential to ensure the adequate power factor in all operating range and to achieve a good power quality without penalizing the efficiency, volume and cost. The requirements imposed by electromagnetic interference (EMI) standards should also be complied. For this task, normally an EMI filter is connected in the grid side of the converter. In one embodiment, the EMI filter is connected in series between the AC side and the input filter.

In the following analysis is considered that symmetrical, three-phase rotary voltages are supplied to the MC. The dynamic of the input filter is considered negligible. Input line to neutral (g point in FIG. 1) voltages represented in FIG. 1 can be given by equation 1, where $V_i$ is the peak value of the three-phase input voltages, and $\omega_i$ is the frequency of the three-phase power source in radians per second.

$$v_a(t) = V_i \cos(\omega_i t + \alpha_i)$$
$$v_b(t) = V_i \cos\left(\omega_i t - \frac{2\pi}{3} + \alpha_i\right)$$
$$v_c(t) = V_i \cos\left(\omega_i t + \frac{2\pi}{3} + \alpha_i\right)$$

Equation 1

The transformer is used to provide galvanic isolation between the grid and the battery pack and its parameters are used to optimize the switching losses. Moreover, voltage adaptation is also an important feature when there are a significant difference between the amplitude of the input and the output voltages. Power density increases as the operating frequency of the transformer raise, resulting in a reduction of volume and weight. In order to simplify the explanation, in this analysis the transformer is modeled by primary-referred leakage inductance L, and an ideal transformer with turns ratio n. Naturally, other elements must then be considered for modeling the transformer, such as the magnetizing inductance, the primary and secondary windings resistance, inter-winding capacitance, and the core losses.

Figure 7:
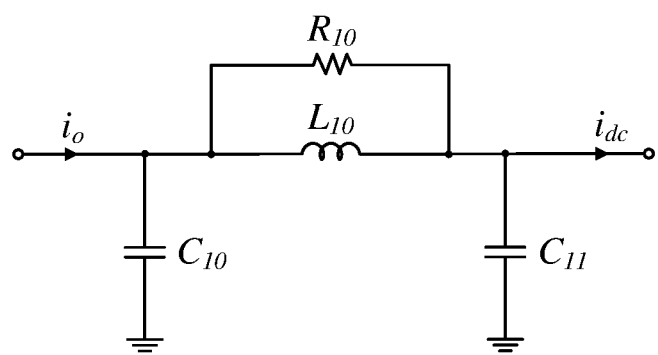
FIG. 7: Generalized structure for the output filter.

The FB establishes the connection between the secondary of the HFT and the output filter. With the proposed control system, the FB works as a current source in its output, represented by current $i_o$. DC voltage $v_o$ is held almost constant through a small filter capacitor. FIG. 7 show a generalized structure for the output filter, where parasitic elements of the components are not considered. The filter parameters should be adjusted to choose the most suitable filter topology for a given set of specifications. For example, depending of the limit specified for the ripple in current $i_{dc}$ (FIG. 1), some components can be added or excluded from the output filter. A second-order LC filter is used in FIG. 1 to reduce the current ripple supplied to the energy storage device.

Modulation

The MC is fed by a voltage source, thus to avoid a short circuit of the input voltages, only one input phase may be connected to each P or N bar in FIG. 1 at a time. On the other hand, the inductive nature of the transformer makes it impossible to interrupt $i_L$ current suddenly, and therefore, at least one switch must be connected to each bar. Considering these constraints, the three-phase-to-single-phase MC has only nine feasible switching states. Table I summarizes the allowed switch states, the respective voltage applied to the primary of the transformer and the currents in the MC input. Regarding the state of switches $S_{xy}$, 1 is used to represent the ON mode and 0 to represent the OFF mode. Each switching state of the MC specifies one input current space vector. These vectors can be called as current SSV and are listed in table 1.

TABLE I

Feasible switching states of the three-phase-to-single-phase MC.

| State | $S_{aP}$ | $S_{bP}$ | $S_{cP}$ | $S_{aN}$ | $S_{bN}$ | $S_{cN}$ | $V_P$ | $i_a$ | $i_b$ | $i_c$ | SSV |
|---|---|---|---|---|---|---|---|---|---|---|---|
| 1 | 1 | 0 | 0 | 0 | 1 | 0 | $V_{ab}$ | $i_L$ | $-i_L$ | 0 | $I_1$ |
| 2 | 1 | 0 | 0 | 0 | 0 | 1 | $-V_{ca}$ | $i_L$ | 0 | $-i_L$ | $I_2$ |

TABLE I-continued

Feasible switching states of the three-phase-to-single-phase MC.

| State | $S_{aP}$ | $S_{bP}$ | $S_{cP}$ | $S_{aN}$ | $S_{bN}$ | $S_{cN}$ | $v_P$ | $i_a$ | $i_b$ | $i_c$ | SSV |
|---|---|---|---|---|---|---|---|---|---|---|---|
| 3 | 0 | 1 | 0 | 0 | 0 | 1 | $V_{bc}$ | 0 | $i_L$ | $-i_L$ | $I_3$ |
| 4 | 0 | 1 | 0 | 1 | 0 | 0 | $-V_{ab}$ | $-i_L$ | $i_L$ | 0 | $I_4$ |
| 5 | 0 | 0 | 1 | 1 | 0 | 0 | $V_{ca}$ | $-i_L$ | 0 | $i_L$ | $I_5$ |
| 6 | 0 | 0 | 1 | 0 | 1 | 0 | $-V_{bc}$ | 0 | $-i_L$ | $i_L$ | $I_6$ |
| 7 | 1 | 0 | 0 | 1 | 0 | 0 | 0 | 0 | 0 | 0 | $I_7$ |
| 8 | 0 | 1 | 0 | 0 | 1 | 0 | 0 | 0 | 0 | 0 | $I_8$ |
| 9 | 0 | 0 | 1 | 0 | 0 | 1 | 0 | 0 | 0 | 0 | $I_9$ |

Figure 8:
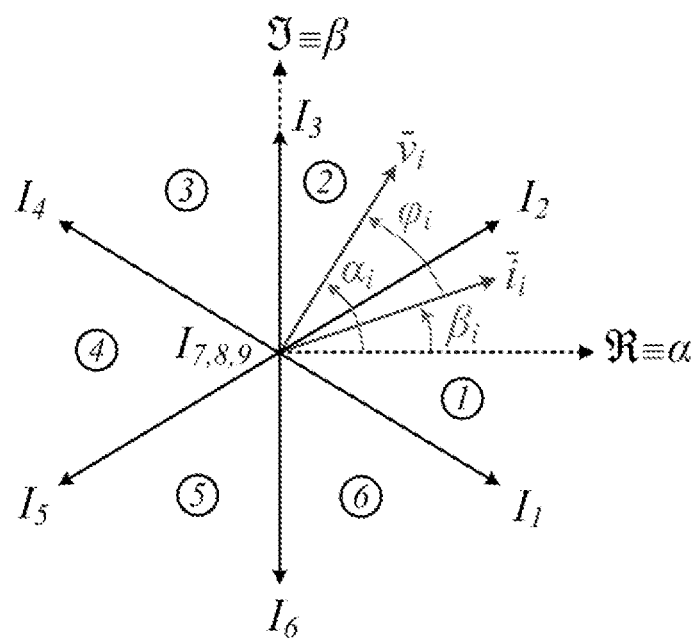
FIG. 8: Input current switching space vectors (SSV) representation in $\alpha\beta$ frame.

The space vector approach is based on the instantaneous space vector representation of voltages and currents. The current SSV have fixed directions and are π/3 radians evenly spaced in the αβ reference frame. Sector numbers 1 to 6, given by variable K, are assigned for the vector spaces between two adjacent SSV. For example, sector 1 is limited by $I_1$ and $I_2$, and corresponds to the space between −π/6 and π/6 radians measured from the real axis ($\Re$). FIG. 8 shows the current SSV along with the instantaneous representation of the input voltage ($\bar{v}_i$) and input current ($\bar{i}_i$) space vectors in the αβ reference frame. Each complex space vector is obtained through the multiplication of the abc components by a proper unitary complex phase shifter [17]. The instantaneous input voltage space vector is obtained from the measurement of voltages $v_a(t)$, $v_b(t)$ and $v_c(t)$ as equation 2, where $\alpha_i$ is the angle of the input voltage space vector. The instantaneous input current space vector is defined as equation 3, where $i_a(t)$, $i_b(t)$ and $i_c(t)$ are the measured currents in the MC input.

$$\bar{v}_i = \frac{2}{3}\left(v_a(t) + v_b(t)e^{j\frac{2\pi}{3}} + v_c(t)e^{j\frac{4\pi}{3}}\right) = V_i e^{j\alpha_i} \quad \text{Equation 2}$$

$$\bar{i}_i = \frac{2}{3}\left(i_a(t) + i_b(t)e^{j\frac{2\pi}{3}} + i_c(t)e^{j\frac{4\pi}{3}}\right) \quad \text{Equation 3}$$

At any given sampling instant, the input current displacement angle $\varphi_i$ is a set-point of the modulation module. The input line-to-neutral voltage vector $\bar{v}_i$ is imposed by the source voltages and is obtained through measurements. Then, the control of the input side of the converter can be achieved, controlling the phase angle $\beta_i$ of the input current vector. Therefore, the desired phase angle $\beta_i$ for the input current $\bar{i}_1$ is defined as equation 4.

$$\beta_i = \alpha_i - \varphi_i \quad \text{Equation 4}$$

At any instant of time, the reference current vector will be in a particular sector of the αβ reference frame. Using the same transformation previously described, the reference current space vector is given by equation 5, where the average current of each input phase a, b, c can be defined as equation 6, where $I_i$ is the peak of the average input currents of the MC, and $\beta_i$ is the angle of the average input current space vector.

$$\bar{i}_{i,ref} = \frac{2}{3}\left(\langle i_a\rangle + \langle i_b\rangle e^{j\frac{2\pi}{3}} + \langle i_c\rangle e^{j\frac{4\pi}{3}}\right) = I_i e^{j\beta_i} \quad \text{Equation 5}$$

$$\langle i_a\rangle = I_i \cos(\omega_i t + \beta_i)$$

$$\langle i_b\rangle = I_i \cos\left(\omega_i t - \frac{2\pi}{3} + \beta_i\right)$$

$$\langle i_c\rangle = I_i \cos\left(\omega_i t + \frac{2\pi}{3} + \beta_i\right) \quad \text{Equation 6}$$

Figure 9:
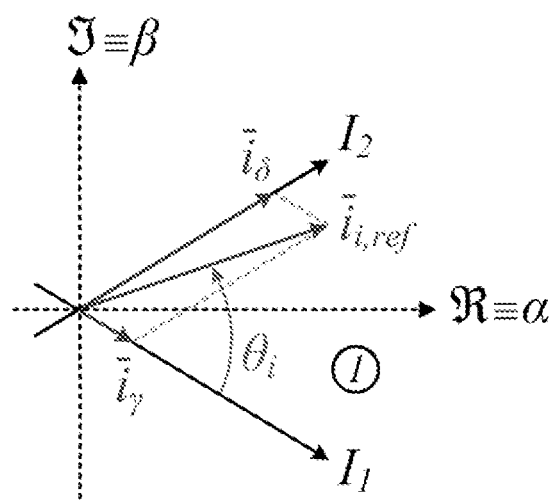
FIG. 9: Input current vector synthesis.

The space vector modulation is based on the selection of space vectors in order to approximate the current reference $\bar{i}_{i,ref}$. It will be assumed that the input current space vector is lying in sector 1, but this approach can be extended to the other sectors without loss of generality. The two adjacent nonzero SSV ($I_K$, K=1, ..., 6) are selected as represented in FIG. 9.

Vector $\bar{i}_{i,ref}$ is decomposed into components $\bar{i}_\gamma$ and $\bar{i}_\delta$ along the two adjacent current SSV. For this example, space vectors $I_1$ and $I_2$ are used to synthesize $\bar{i}_\gamma$ and $\bar{i}_\delta$ respectively. This can be expressed by the relations in equation 7.

$$\bar{i}_{i,ref} = \bar{i}_\gamma + \bar{i}_\delta$$

$$\bar{i}_\gamma = d_\gamma I_1$$

$$\bar{i}_\delta = d_\delta I_2 \quad \text{Equation 7}$$

Input current reference vector is synthesized by considering the proper duty cycles $d_\gamma$ and $d_\delta$. The angle $\theta_i$ represents the angle of $\bar{i}_{i,ref}$ within the actual sector, as show in FIG. 9. This angle is measured with respect to the SSV associated with the $\bar{i}_\gamma$ vector. The angle $\theta_i$ is calculated by equation 8 and is limited by equation 9.

$$\theta_i = \beta_i - K\frac{\pi}{3} + \frac{\pi}{2} \quad \text{Equation 8}$$

$$0 \leq \theta_i < \frac{\pi}{3} \quad \text{Equation 9}$$

The duty cycles for the two general switching states are calculated using the relationships in equation 10, where $m_{\gamma\delta}$ is the basic modulation index that is set by the user or by an external system to adjust the amplitude of $\bar{i}_{i,ref}$. The zero space vectors ($I_z = I_7$, $I_8$ or $I_9$) are used to complete the modulation period, whose duty cycle is calculated by equation 11.

$$d_\gamma = m_{\gamma\delta}\sin\left(\frac{\pi}{3} - \theta_i\right) \quad \text{Equation 10}$$

$$d_\delta = m_{\gamma\delta}\sin(\theta_i)$$

$$d_{0\gamma\delta} = 1 - d_\gamma - d_\delta \quad \text{Equation 11}$$

Since $d_{0\gamma\delta} \geq 0$, $d_\gamma \geq 0$, and $d_\delta \geq 0$, the maximum basic modulation index is limited to 1, so $0 \leq m_{\gamma\delta} \leq 1$.

Figure 10:
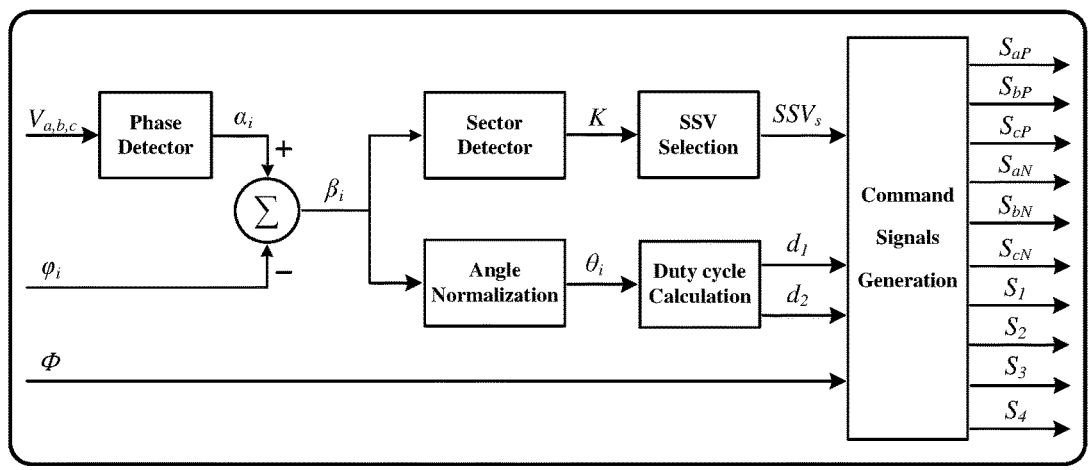
FIG. 10: Diagram with the main blocks of the modulation.

FIG. 10 represents the main blocks of the modulation. With the description presented until this point, half of the diagram is already covered. Following will be presented the other blocks that complete the modulation and allow the generation of the command signals for the MC and the FB.

Figure 11:
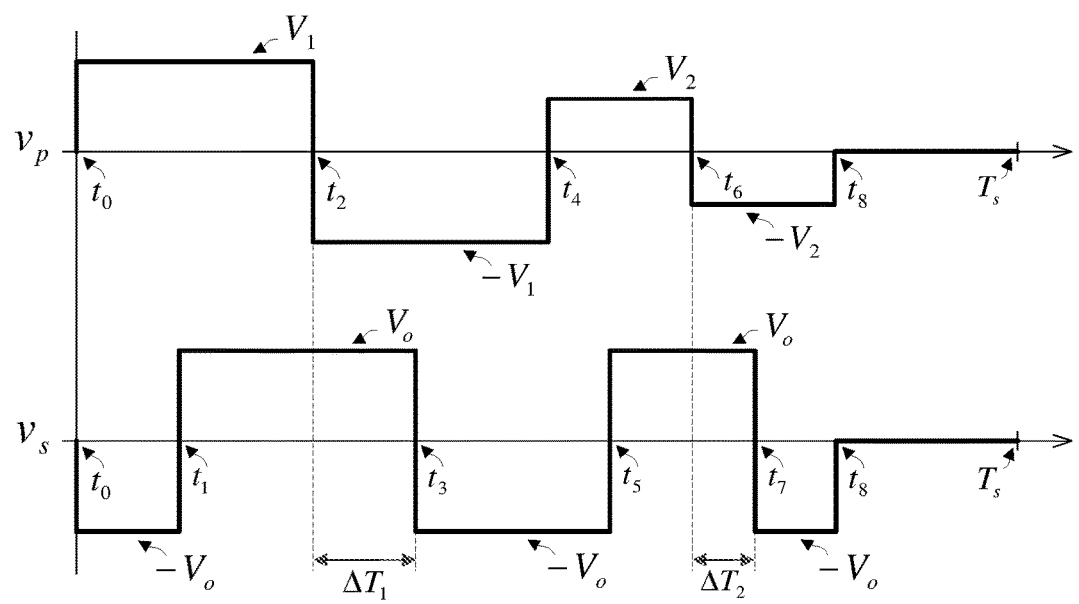
FIG. 11: Modulation principle for positive phase-shift.

The MC changes the low-frequency input voltage into a high-frequency voltage, $v_p$. This voltage is applied to the primary of the HFT which provides galvanic isolation to the PCS, and makes it possible to store energy using the transformer leakage inductance, L. The MC applies the current SSV of table I in a square wave fashion. For this analysis, it is also considered that the amplitude of voltages $v_p$ and $v_s$ is constant during one period of modulation, $T_s$. In practice, this can be approximately achieved if the switching frequency is sufficiently higher compared to $\omega_1$. Table II shows the applied SSV and the corresponding voltage $v_p$ according to the sector K. The resulting voltage $v_p$ that is applied in the HFT is the temporal reference of the modulation. The modulation period of $v_p$ can be divided into five different intervals as represented in FIG. 11. The first and second intervals have the same duration and comprise the period associated to duty cycle $d_1$. A positive and a negative voltage pulses are applied through the current SSV to generate $\tilde{i}_y$ component. The amplitude of these pulses is represented in FIG. 11 by $V_1$ and corresponds to respective voltage $v_p$ listed in table II. For example, if the current reference $\tilde{i}_{i,ref}$ is in sector 1, then $I_1$ and $I_4$ space vectors are selected. In the following analysis will be considered $t_0=0$. Space vector $I_1$ is applied until instant $t_2$, and then space vector $I_4$ is applied until instant $t_4$, as defined in equation 14. The symmetry between positive and negative pulses is necessary in order to avoid the flux walking of the HFT core. The third and fourth intervals are symmetric and comprise the period associated to duty cycle $d_2$. A positive and a negative voltage pulses are applied through the current SSV to generate $\tilde{i}_\delta$ component. The amplitude of these pulses is represented in FIG. 11 by $V_2$ and corresponds to respective voltage $v_p$ listed in table II. For sector 1, space vector $I_2$ is applied between instant $t_4$ and $t_6$, and space vector $I_5$ is applied between instant $t_6$ and $t_8$. Finally, one of the zero SSV ($I_z$) is applied during the fifth interval, between instant $t_8$ and $T_s$, to complete the modulation period. There are several possibilities to choose the zero vectors, since all apply the same voltage to the transformer. Table II shows the zero vectors to be used in each sector in order to minimize the number of commutations.

TABLE II

SSV and corresponding voltage $v_p$ applied by the MC according to the sector.

| Sector | Duty cycle | Positive pulse SSV | $v_P$ | Negative pulse SSV | $v_P$ | Zero SSV |
|---|---|---|---|---|---|---|
| 1 | d1 | $I_1$ | $V_{ab}$ | $I_4$ | $-V_{ab}$ | $I_7$ |
|   | d2 | $I_2$ | $-V_{ca}$ | $I_5$ | $V_{ca}$ |  |
| 2 | d1 | $I_2$ | $-V_{ca}$ | $I_5$ | $V_{ca}$ | $I_9$ |
|   | d2 | $I_3$ | $V_{bc}$ | $I_6$ | $-V_{bc}$ |  |
| 3 | d1 | $I_3$ | $V_{bc}$ | $I_6$ | $-V_{bc}$ | $I_8$ |
|   | d2 | $I_4$ | $-V_{ab}$ | $I_1$ | $V_{ab}$ |  |
| 4 | d1 | $I_4$ | $-V_{ab}$ | $I_1$ | $V_{ab}$ | $I_7$ |
|   | d2 | $I_5$ | $V_{ca}$ | $I_2$ | $-V_{ca}$ |  |
| 5 | d1 | $I_5$ | $V_{ca}$ | $I_2$ | $-V_{ca}$ | $I_9$ |
|   | d2 | $I_6$ | $-V_{bc}$ | $I_3$ | $V_{bc}$ |  |
| 6 | d1 | $I_6$ | $-V_{bc}$ | $I_3$ | $V_{bc}$ | $I_8$ |
|   | d2 | $I_1$ | $V_{ab}$ | $I_4$ | $-V_{ab}$ |  |

The FB applies voltage $v_s$ to the secondary of the HFT. The difference between voltages $v_s$ and $v_p$ result in voltage $v_L$ which is applied to the leakage inductance L. Thus, the power transfer between the two voltage sources (MC and FB) can be controlled by the amplitude and the difference of phase between voltages $v_s$ and $v_p$. The amplitude of $v_p$ is imposed by the input three-phase voltage source, and the amplitude of $v_s$ is dependent of the energy storage device. Thus, power flow is controlled by introducing a phase-shift, $\varphi$, between voltages $v_s$ and $v_p$, changing in this way the amplitude of $I_t$ and consequently the current transferred to the energy storage device. The phase-shift is limited by equation 12, and can be normalized by making $$\delta = \phi / \frac{\pi}{2}$$

resulting in the limit defined in equation 13.

$$-\frac{\pi}{2} \leq \phi \leq \frac{\pi}{2} \qquad \text{Equation 12}$$

$$-1 \leq \delta \leq 1 \qquad \text{Equation 13}$$

FIG. 11 shows a modulation period for positive phase-shift of voltage $v_s$ relatively to voltage $v_p$. The total duration of the positive and negative pulses of voltage $v_s$ is exactly the same of voltage $v_p$. The positive pulse between instant $t_1$ and $t_3$ is positively phase-shift by $\Delta T_1$ related to the positive pulse of $v_p$ between instant $t_0$ and $t_2$. The same approach is used for the second positive pulse between instant $t_5$ and $t_7$, that is positively phase-shift by $\Delta T_2$ related to the positive pulse of $v_p$ between instant $t_4$ and $t_6$. Negative pulses are applied during intervals $[t_0,t_1]$, $[t_3,t_5]$ and $[t_7,t_8]$ to ensure a proper flux balance in the HFT, as defined in equation 14. The zero voltage is applied between instant $t_8$ and $T_s$ in order to complete the modulation period and is given by duty cycle $d_0$. Table III shows the four feasible switching states of the FB converter. Positive pulses are generated by state 11 and the negative pulses by state 12. The amplitude of voltage $v_s$ for state 11 is equal to $V_o$, the voltage in the output of the FB. On other hand, the amplitude of voltage $v_s$ for state 12 is equal to $-V_o$, the symmetric of the voltage in the output of the FB. States 13 and 14 are used to apply the zero voltage in the secondary of the HFT. Since there are two zero states, they can be selected for example to reduce the number of commutations.

TABLE III

Feasible switching states of the FB converter.

| State | $S_1$ | $S_2$ | $S_3$ | $S_4$ | $v_s$ | $i_o$ |
|---|---|---|---|---|---|---|
| 11 | 1 | 1 | 0 | 0 | $V_o$ | $n \cdot i_L$ |
| 12 | 0 | 0 | 1 | 1 | $-V_o$ | $-n \cdot i_L$ |
| 13 | 1 | 0 | 1 | 0 | 0 | 0 |
| 14 | 0 | 1 | 0 | 1 | 0 | 0 |

$$t_0 = 0 \qquad \text{Equation 14}$$

$$t_1 = t_0 + \Delta T_1 = \frac{\delta}{2}\frac{d_1}{2}T_s$$

$$t_2 = \frac{d_1}{2}T_s$$

$$t_3 = \left(\frac{\delta}{2} + 1\right)\frac{d_1}{2}T_s$$

$$t_4 = d_1 T_s$$

$$t_5 = t_4 + \Delta T_2 = d_1 T_s + \frac{\delta}{2}\frac{d_1}{2}T_s$$

$$t_6 = \left(d_1 + \frac{d_2}{2}\right)T_s$$

$$t_7 = d_1 T_s + \left(\frac{\delta}{2} + 1\right)\frac{d_2}{2}T_s$$

$$t_8 = (d_1 + d_2)T_s$$

Figure 12:
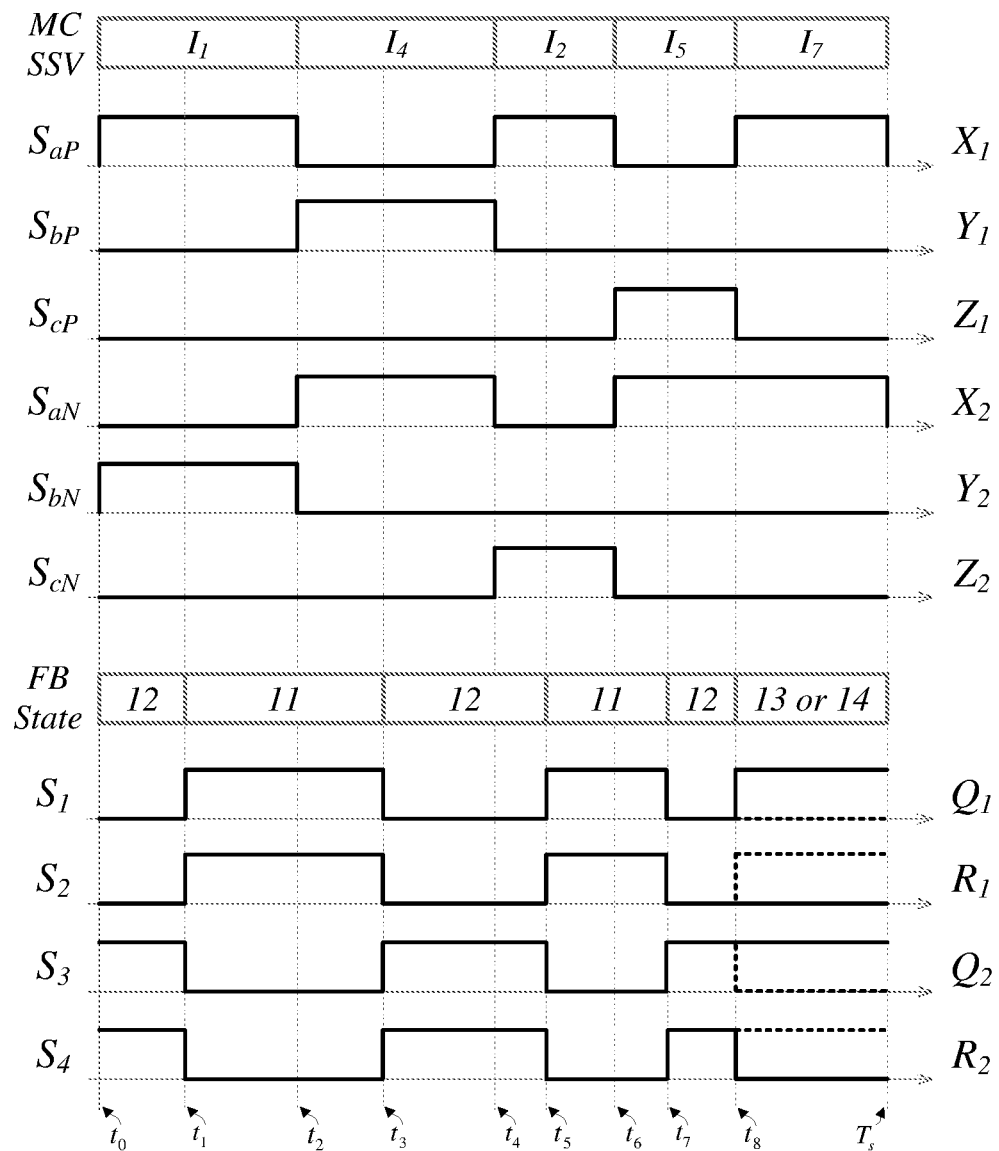
FIG. 12: Example of possible command signals for MC and FB for positive phase-shift and sector 1.

FIG. 12 shows an example of possible command signals for the MC and the FB for positive phase-shift and when the current reference vector is in sector 1. Intermediate signals $X_1$, $Y_1$, $Z_1$, $X_2$, $Y_2$, $Z_2$ have a specific pattern and are independent of the sector. Using Table IV is possible to do the routing of these intermediate signals to the command signals $S_{xy}$ of the MC according the actual sector. On other hand, signals $Q_1$, $R_1$, $Q_2$, $R_2$ can only have slight variations across the sectors due to the choice between the two zero states.

TABLE IV

Intermediate signals routing.

| Sector | $S_{aP}$ | $S_{bP}$ | $S_{cP}$ | $S_{aN}$ | $S_{bN}$ | $S_{cN}$ |
|---|---|---|---|---|---|---|
| 1 | $X_1$ | $Y_1$ | $Z_1$ | $X_2$ | $Y_2$ | $Z_2$ |
| 2 | $Y_2$ | $Z_2$ | $X_2$ | $Y_1$ | $Z_1$ | $X_1$ |
| 3 | $Z_1$ | $X_1$ | $Y_1$ | $Z_2$ | $X_2$ | $Y_2$ |
| 4 | $X_2$ | $Y_2$ | $Z_2$ | $X_1$ | $Y_1$ | $Z_1$ |
| 5 | $Y_1$ | $Z_1$ | $X_1$ | $Y_2$ | $Z_2$ | $X_2$ |
| 6 | $Z_2$ | $X_2$ | $Y_2$ | $Z_1$ | $X_1$ | $Y_1$ |

Figure 13:
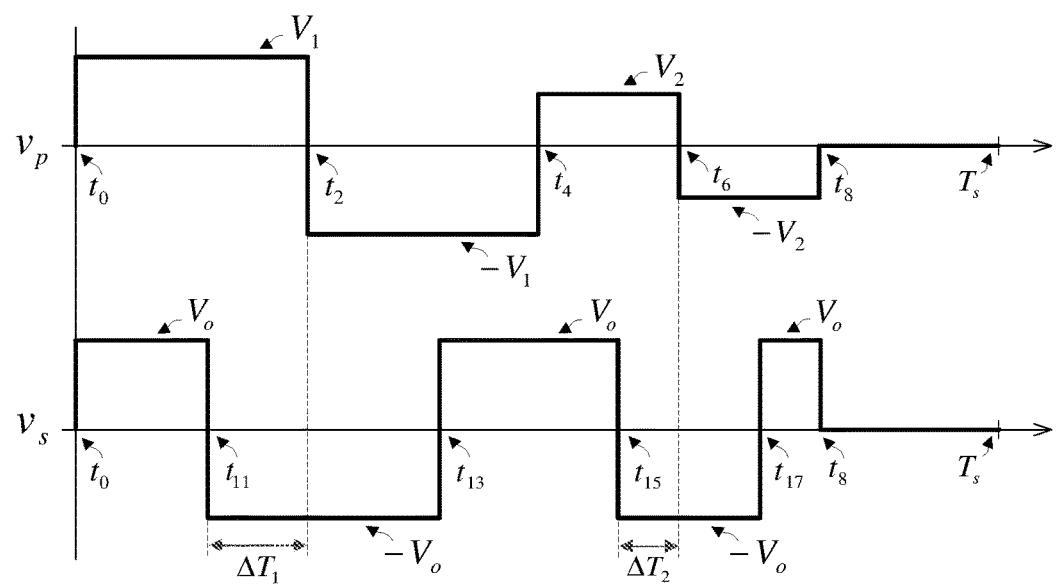
FIG. 13: Modulation principle for negative phase-shift.

Using a positive phase-shift the power is transferred from the grid to the energy storage device or dc network. If a negative phase-shift is used then the power is transferred from the energy storage device to the grid. FIG. 13 shows the modulation principle for negative phase-shift operation, which is very similar to the previously presented for positive phase-shift. The different time instants of the modulation are defined in equation 15. The negative pulse of $v_s$ between instant $t_{11}$ and $t_{13}$ is negatively phase-shift by $\Delta T_1$ related to the negative pulse of $v_p$ between instant $t_2$ and $t_4$. The same approach is used for the second negative pulse of $v_s$ between instant $t_{15}$ and $t_{17}$, that is negatively phase-shift by $\Delta T_2$ related to the negative pulse of $v_p$ between instant $t_6$ and $t_8$. Positive pulses are applied during intervals $[t_0,t_{11}]$, $[t_{13}, t_{15}]$ and $[t_{17},t_8]$ to avoid flux walking in the HFT core. The zero voltage is applied between instant $t_8$ and $T_s$ in order to complete the modulation period and is given by duty cycle $d_0$.

$$t_{11} = t_3 = \left(\frac{\delta}{2}+1\right)\frac{d_1}{2}T_s \quad \text{Equation 15}$$

$$t_{13} = \left(\frac{\delta}{4}+1\right)d_1 T_s$$

$$t_{15} = d_1 T_s + \left(\frac{\delta}{2}+1\right)\frac{d_2}{2}T_s$$

$$t_{17} = d_1 T_s + \left(\frac{\delta}{4}+1\right)d_2 T_s$$

Figure 14:
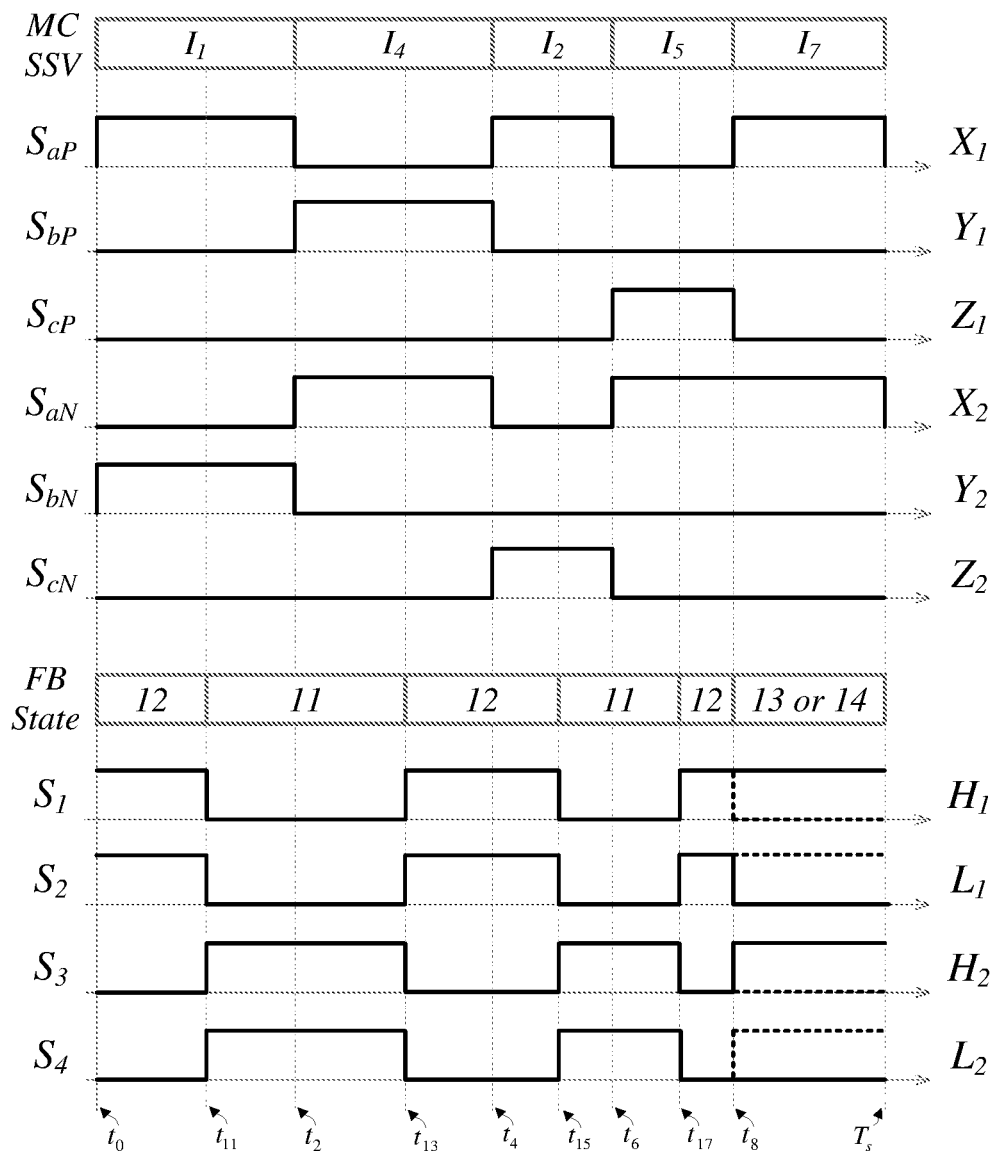
FIG. 14: Example of possible command signals for MC and FB for negative phase-shift and sector 1.

FIG. 14 shows an example of possible command signals for the MC and the FB for negative phase-shift and when the current reference vector is in sector 1. Intermediate signals $X_1, Y_1, Z_1, X_2, Y_2, Z_2$ are exactly the same presented in FIG. 12. Such as for the positive phase-shift case, $H_1, L_1, H_2, L_2$ can only have slight variations across the sectors due to the choice between the two zero states.

Considering voltages $v_p$, $v_s$ and the resulting voltage $v_L$ applied in the inductance L, it is possible to establish a set of equations to analytically represent current $i_L$. By table I is possible to know how the current $i_L$ is reflected in the MC input. Thus, the average currents in the input of the MC for the sector 1 over one modulation period can be given by equation 16, where $\omega_S$ is the modulation frequency in radians per second and is given by $\omega_S=2\pi/T_S$. In order to modulate the reference input current vector of equation 5, it is necessary to choose duty cycles $d_1$ and $d_2$ as equation 17, where m is the modulation index. The modulation period is completed through the duty cycle $d_0$ that is calculated by equation 18.

$$\langle i_a \rangle = \frac{V_o}{\omega_s L}n\phi\left(1-\frac{|\phi|}{\pi}\right)(d_1^2+d_2^2) \quad \text{Equation 16}$$

$$\langle i_b \rangle = -\frac{V_o}{\omega_s L}n\phi\left(1-\frac{|\phi|}{\pi}\right)d_1^2$$

$$\langle i_c \rangle = -\frac{V_o}{\omega_s L}n\phi\left(1-\frac{|\phi|}{\pi}\right)d_2^2$$

$$d_1 = \sqrt{d_\gamma} = m\sqrt{\sin\left(\frac{\pi}{3}-\theta_i\right)} \quad \text{Equation 17}$$

$$d_2 = \sqrt{d_\delta} = m\sqrt{\sin(\theta_i)}$$

$$d_0 = 1 - d_1 - d_2. \quad \text{Equation 18}$$

The zero voltage is applied by the MC using the zero SSV ($I_z=I_7$, $I_8$ or $I_9$), and by the FB through states 13 and 14 of table III. Since $d_0 \geq 0$, $d_1 \geq 0$, and $d_2 \geq 0$, the modulation index is limited to $1/\sqrt{2}$, so $0 \leq m \leq 1/\sqrt{2}$. Since the amplitude of current $I_i$ can be controlled by the phase-shift $\varphi$, the modulation index can be set to its maximum value to not limit the transferred power. In the following description the modulation index will be considered $m=1/\sqrt{2}$ without loss of generality.

By averaging the three-phase currents in the input of the MC with these duty cycles over one modulation period, and considering the space vector transformation, it is possible to obtain the average value of $I_i$ as defined in equation 19.

$$\langle I_i \rangle = \frac{1}{2}\frac{V_o}{\omega_s L}n\phi\left(1-\frac{|\phi|}{\pi}\right) \quad \text{Equation 19}$$

This result is also valid for the other sectors in the $\alpha\beta$ reference frame. Considering equation 2, equation 5, and equation 19, the active and reactive power is given by equation 20, using the well-known definitions for active power (P) and reactive power (Q).

$$P_i = \frac{3}{2}\text{R}\{\bar{v}_i \cdot \bar{i}_i^*\} = \frac{3}{4}\frac{V_i V_o}{\omega_s L}n\phi\left(1-\frac{|\phi|}{\pi}\right)\cos(\varphi_i) \quad \text{Equation 20}$$

$$Q_i = \frac{3}{2}\text{T}\{\bar{v}_i \cdot \bar{i}_i^*\} = \frac{3}{4}\frac{V_i V_o}{\omega_s L}n\phi\left(1-\frac{|\phi|}{\pi}\right)\sin(\varphi_i)$$

Through table III is possible to know how current $i_L$ is reflected in the FB output. Assuming that the power losses in the conversion system are zero, the average current in the output of the converter over one modulation period can be expressed as defined in equation 21.

$$\langle i_o \rangle = \frac{3}{4}\frac{V_i}{\omega_s L}n\phi\left(1-\frac{|\phi|}{\pi}\right)\cos(\varphi_i) \quad \text{Equation 21}$$

With this result is possible to determine the average output power of the PCS as defined in equation 22.

$$P_o = v_o\langle i_o \rangle = \frac{3}{4}\frac{V_i V_o}{\omega_s L}n\phi\left(1-\frac{|\phi|}{\pi}\right)\cos(\varphi_i) \quad \text{Equation 22}$$

As expected, the input active power (equation 20) is equal to the output power (equation 22) since it was considered that the power losses during the conversion process are zero.

Moreover, the modulation executed by the control system allows to control simultaneously the power factor in the AC side interface through the variable $\varphi_i$ (equation 20), and the current regulation in the DC side through phase-shift $\varphi$ (equation 21).

Figure 15:
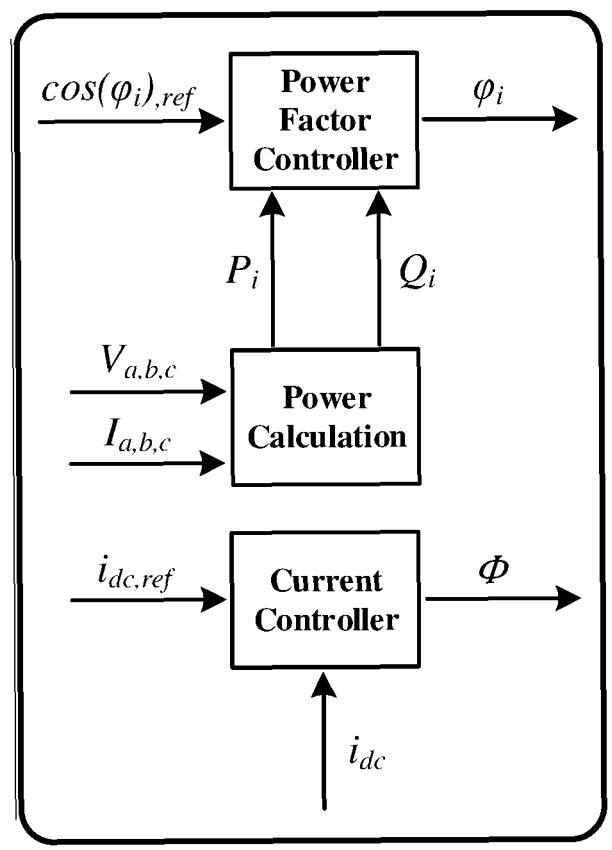
FIG. 15: Diagram of a control strategy for output current regulation.

With these control variables there are flexibility to implement several control strategies for the PCS. One possibility consist in having a current controller that imposes the proper phase-shift in order to regulate the output current $i_{dc}$, as shown in FIG. 15. A power factor controller gives the set-point for the input $\varphi_i$ in order to impose the power factor in the AC side according the reference $\cos(\varphi_i)_{ref}$.

Figure 16:
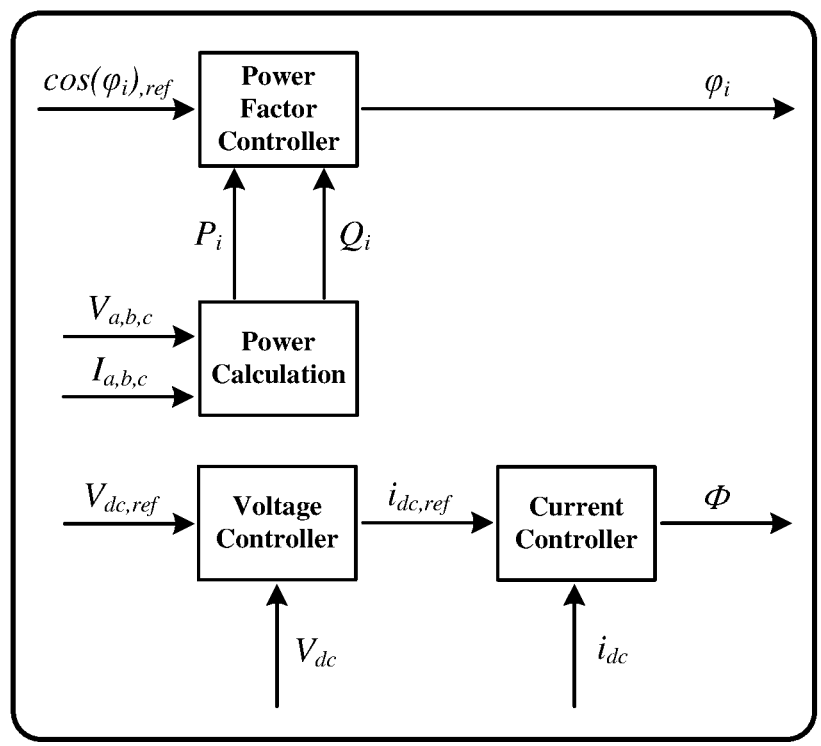
FIG. 16: Diagram of a control strategy for output voltage regulation.

If the objective is to regulate the output voltage $v_{dc}$, an outer control loop can be added to the previous strategy, as shown in FIG. 16. A voltage controller sets the reference for the output current $i_{dc}$, which in turn is regulated by the internal current controller.

Figure 17:
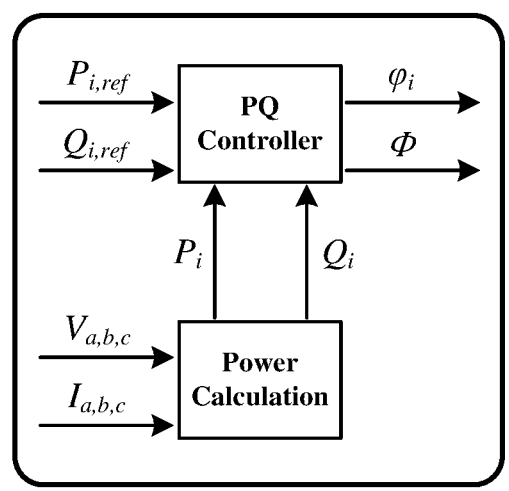
FIG. 17: Diagram of a control strategy for PQ regulation.

FIG. 17 shows another example comprising a control strategy for PQ regulation. The required displacement angle and phase-shift can be generated by a PQ controller in order to regulate the active and reactive power level in the grid interface. The amplitude of the output current $i_{dc}$ in the energy storage device is a result of the active power exchanged with the grid.

The combination of the developed control system with the proposed main circuit results in a single-stage PCS applied, for example, to energy storage devices. The PCS, when compared with conventional solutions, has as advantages a higher power density, longer service life, higher power quality in the grid interconnection, power factor control capability, safe operation provided by galvanic isolation, wide DC voltage range of energy storage devices, and DC current regulation with low current ripple.

EXAMPLES

The disclosed technology can be applied in diverse PCSs.

As unidirectional power converter, this technology can be used in both—AC to DC or DC to AC conversion. Major DC to AC converter applications are based on grid-tied or standalone inverters for energy harvesting from renewable or other direct current sources, requiring galvanic isolation. In AC to DC conversion, the proposed technology can be used for conventional battery chargers and power supplies with galvanic isolation. Solar or wind power inverters, battery chargers for industrial equipment, high power DC sources for industrial processes, and energy supply in DC for electronic equipment, datacenters, variable frequency drives, etc., are examples of possible applications.

As bidirectional power converter it can be used for battery-based stationary energy storage systems, electric vehicle battery chargers with reverse power flow functionality, energy supply of DC loads with regenerative capabilities, interface between low voltage AC and low voltage DC networks.

A particular application is in distributed energy storage systems under the so called "Community Energy Storage" concept. The need to integrate renewable based energy sources and heavy loads such as electric vehicles, in the low voltage grid is demanding new levels of flexibility and reliability. As a relatively new concept, the community energy storage can be a key solution to mitigate the technical impacts of this large integration and has been a solution that leads to high expectations, particularly from distribution system operators. Some advanced functionalities can be provided by these systems, such as voltage support, frequency regulation, peak shaving and load leveling, buffer and smooth renewable energy variability, grid upgrade deferral or even power factor correction and harmonic filtering.

Another particular example of application can be the electric vehicles market exploring the so called "Vehicle-to-Grid" (V2G) concept. The electric vehicles are typically parked 95% of the time. Since they have energy stored in its batteries, some of this energy can be used to support the electric grid by supplying power at some demanding periods of the day. A bidirectional charger is necessary to supply the batteries during charging operation, and to discharge the batteries during V2G operation. Due to space limitation in the electric vehicle, the PCS disclosed has a great potential for V2G applications since can result in a compact converter. Currently, the available chargers in the market don't have this functionality, but is expected to be a common solution in the future, particularly in the smart home paradigm.

Additional application examples are the DC supply networks, which will become a tendency for the near future. This type of solution has been demonstrated in large computational systems, such as datacenters, and in modern networks with combined production of renewable energy with energy storage. In all these cases there have been significant gains in energy efficiency. Being power electronic converters the key enabler of this new type of networks, the proposed technology can be applied in the implementation of a bidirectional power interface between the existing AC low voltage network and the emerging DC networks.

In the case of the variable frequency drives, a major industrial market for power electronics, this solution can be applied to supply the DC bus of large groups of devices in low to mid power range. This way, the regenerative braking will become economically feasible in this power range, since the drive units itself are simpler and cheaper, and the regenerative braking functionality lies in a central bidirectional converter.

Naturally, the present embodiments are not in any way limited to the embodiments described in this document and a person with average knowledge in the field will be able to predict many possible changes to it without deviating from the main idea, as described in the claims.

REFERENCES

[1] S. Vazquez, S. M. Lukic, E. Galvan, L. G. Franquelo, and J. M. Carrasco, "Energy Storage Systems for Transport and Grid Applications," *Industrial Electronics, IEEE Transactions on*, vol. 57, pp. 3881-3895, 2010.

[2] Y. Gao, M. Li, P. Kuang, W. Wang, and J. Chen, "Battery charge and discharge device," China Patent CN101604853, 2009.

[3] M. N. Kheraluwala, R. W. Gascoigne, D. M. Divan, and E. D. Baumann, "Performance characterization of a high-power dual active bridge," *Industry Applications, IEEE Transactions on*, vol. 28, pp. 1294-1301, 1992.

[4] C. Ga-Gang, J. Doo-Yong, C. Sung-Chop, W. Chung-Yuen, J. Yong-Chae, and Y. Jang-Hyoun, "10 kW rapid-charger for electric vehicle considering vehicle to grid (V2G)," in *Power Electronics and Motion Control Conference (IPEMC), 2012 7th International*, 2012, pp. 2668-2672.

[5] "Power Conversion Device and Charging device," Japan Patent JP2013021867, 2013.

[6] Y. Zhaoyang, J. Minli, Z. Chunjiang, and W. Weiyang, "An Integration SPWM Strategy for High-Frequency Link Matrix Converter With Adaptive Commutation in One Step Based on De-Re-Coupling Idea," *Industrial Electronics, IEEE Transactions on*, vol. 59, pp. 116-128, 2012.

[7] S. Ratanapanachote, C. Han Ju, and P. N. Enjeti, "A digitally controlled switch mode power supply based on matrix converter," *Power Electronics, IEEE Transactions on*, vol. 21, pp. 124-130, 2006.

[8] Y. Wei, W. Wu, C. Yan, D. Zhang, W. Zhang, Z. Zhang, et al., "Synchronous and frequency-doubling jagged carrier generating circuit of high-frequency link matrix type inverter," China Patent CN101702588, 2010.

[9] D. Sha, Z. Qin, D. Wu, and X. Liao, "A Digitally Controlled Three-Phase Cycloconverter Type High Frequency AC Link Inverter Using Space Vector Modulation," *Journal of Power Electronics (KIPE)*, vol. 11, pp. 28-36, 2011.

[10] D. Sha, Z. Qin, and X. Liao, "Energy storage system and control method thereof," China Patent CN101944745, 2011.

[11] D. Sha, Z. Qin, D. Wu, and X. Liao, "High-frequency isolated three-phase cycloconverter type two-way converter and control method thereof," China Patent CN102075109, 2011.

[12] N. D. Weise, K. Basu, and N. Mohan, "Advanced modulation strategy for a three-phase AC-DC dual active bridge for V2G," in *Vehicle Power and Propulsion Conference (VPPC), 2011 IEEE*, 2011, pp. 1-6.

[13] R. K. Gupta, K. Mohapatra, N. Mohan, G. Castelino, K. Basu, and W. Nathan, "Soft Switching Power Electronic Transformer," United States of America Patent US2011007534, 2011.

[14] H. S. Krishnamoorthy, P. Garg, and P. N. Enjeti, "A matrix converter-based topology for high power electric vehicle battery charging and V2G application," in *IECON 2012-38th Annual Conference on IEEE Industrial Electronics Society*, 2012, pp. 2866-2871.

[15] P. W. Wheeler, J. Rodriguez, J. C. Clare, L. Empringham, and A. Weinstein, "Matrix converters: a technology review," *Industrial Electronics, IEEE Transactions on*, vol. 49, pp. 276-288, 2002.

[16] A. Trentin, P. Zanchetta, J. Clare, and P. Wheeler, "Automated Optimal Design of Input Filters for Direct AC/AC Matrix Converters," *Industrial Electronics, IEEE Transactions on*, vol. 59, pp. 2811-2823, 2012.

[17] L. Huber and D. Borojevic, "Space vector modulated three-phase to three-phase matrix converter with input power factor correction," *Industry Applications, IEEE Transactions on*, vol. 31, pp. 1234-1246, 1995.

The invention claimed is:

1. A single-stage power conversion system, comprising:
a high-frequency transformer;
a three-phase-to-single-phase matrix converter;
a full-bridge AC to DC converter;
a control system having outputs;
a phase detector module, configured to calculate an angle $\alpha_i$ of an input voltage space vector of a three-phase AC side;
an adder module, configured to calculate a desired phase angle $\beta_i$ by subtracting the angle $\alpha_i$ with a set-point input $\varphi_i$;
a sector detector module, configured to calculate a sector K that comprises an input phase angle $\beta_i$;
a switching space vectors selection module, configured to select a switching space vector $SSV_s$ based on the sector K;
an angle normalization module, configured to normalize the phase angle, $\beta_i$, as an angle within a sector, $\theta_i$;
a duty cycle calculation module, configured to calculate duty cycles $d_1$ and $d_2$ for two general switching states based on the angle $\theta_i$; and
a command signals generation module, configured to output ON/OFF signals to the matrix converter and the full-bridge converter switches based on the $SSV_s$, $d_1$, $d_2$ and a phase-shift input $\varphi$,
wherein the control system outputs are connected to switches of the matrix converter and the full-bridge converter.

2. The power conversion system according to claim 1, wherein the full-bridge converter comprises a parallel association of two legs, where each leg is composed by two switches in series.

3. The power conversion system according to claim 1, wherein the control system comprises:
a peak value input of three-phase input voltages $V_{a,b,c}$.

4. The power conversion system according to claim 1, further comprising a current controller configured to regulate an output current $i_{dc}$ imposed by the phase-shift input $\varphi$.

5. The power conversion system according to claim 4, wherein the current controller further comprises an outer control loop configured to set a reference for the output current $i_{dc}$ based on a comparison between a reference $V_{dc,ref}$ and a DC side voltage $V_{dc}$.

6. The power conversion system according to claim 4, wherein the control system further comprises a control loop configured to regulate a power factor in an AC side based on a power calculation and a comparison between a reference $\cos(\varphi_i)_{ref}$ and a $\cos(\varphi_i)$.

7. The power conversion system according to claim 1, further comprising a PQ controller configured to regulate an active and reactive power level based on a power calculation and a comparison with respective reference values.

8. A vehicle-to-grid system, wherein the vehicle-to-grid system comprises the power conversion system of claim 1.

9. A method of use of a single-stage power conversion system, comprising:
a high-frequency transformer;
a three-phase-to-single-phase matrix converter;
a full-bridge AC to DC converter;
a control system having outputs;
a phase detector module, configured to calculate an angle $\alpha_i$ of an input voltage space vector of a three-phase AC side;
an adder module, configured to calculate a desired phase angle $\beta_i$ by subtracting the angle $\alpha_i$ with a set-point input $\varphi_i$;
a sector detector module, configured to calculate a sector K that comprises an input phase angle $\beta_i$;
a switching space vectors selection module, configured to select a switching space vector $SSV_s$ based on the sector K;
an angle normalization module, configured to normalize the phase angle, $\beta_i$, as an angle within a sector, $\theta_1$;
a duty cycle calculation module, configured to calculate duty cycles $d_1$ and $d_2$ for two general switching states based on the angle $\theta_i$; and
a command signals generation module, configured to output ON/OFF signals to the matrix converter and the full-bridge converter switches based on the $SSV_s$, $d_1$, $d_2$ and a phase-shift input $\varphi$,
wherein the control system outputs are connected to switches of the matrix converter and the full-bridge converter.

10. The method of use of the power conversion system according to claim 9, including the step of configuring the system as an inverter for energy harvesting from DC sources.

11. The method of use of the power conversion system according to claim 9, including the step of configuring the system as a battery-based stationary energy storage systems.

12. The method of use of the power conversion system according to claim 9, including the step of configuring the system as an interface between AC networks and DC networks.

13. The method of use of the power conversion system according to claim 9, including the step of configuring the system as an electric vehicle battery charger.

14. The method of use of the power conversion system according to claim 13, wherein the charger is on-board.

* * * * *